United States Patent
Pourchet et al.

(10) Patent No.: US 11,664,476 B2
(45) Date of Patent: May 30, 2023

(54) LED SURFACE MODIFICATION WITH ULTRAVIOLET LASER

(71) Applicant: Meta Platforms Technologies, LLC, Menlo Park, CA (US)

(72) Inventors: Allan Pourchet, Cork (IE); Vincent Brennan, Cork (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/684,901

(22) Filed: Mar. 2, 2022

(65) Prior Publication Data

US 2022/0376135 A1 Nov. 24, 2022

Related U.S. Application Data

(60) Continuation of application No. 17/090,870, filed on Nov. 5, 2020, now Pat. No. 11,302,844, which is a
(Continued)

(51) Int. Cl.
*H01L 33/00* (2010.01)
*H01L 33/22* (2010.01)
(Continued)

(52) U.S. Cl.
CPC .......... *H01L 33/22* (2013.01); *B23K 26/3584* (2018.08); *H01L 33/0062* (2013.01);
(Continued)

(58) Field of Classification Search
CPC . H01L 33/22; H01L 33/0062; H01L 33/0075; H01L 33/30; H01L 33/32; H01L 33/44; H01L 33/46; B23K 26/3584
(Continued)

(56) References Cited

U.S. PATENT DOCUMENTS

2003/0010975 A1    1/2003  Gibb et al.
2003/0218179 A1*  11/2003  Koide .................... H01L 33/22
                                                                    257/E33.068
(Continued)

FOREIGN PATENT DOCUMENTS

JP    2004128445 A    4/2004
JP    2005064247 A    3/2005
(Continued)

OTHER PUBLICATIONS

Huang H-W., et al., "Improvement of InGaN/GaN Light Emitting Diode Performance with a Nano-Roughened p-GaN Surface by Excimer Laser-Irradiation," Materials Chemistry and Physics, Oct. 10, 2006, vol. 99 (2-3), pp. 414-417.
(Continued)

*Primary Examiner* — Sheikh Maruf
(74) *Attorney, Agent, or Firm* — Fenwick & West LLP

(57) ABSTRACT

A laser light is used to modify the surface of the gallium semiconductor layer of an LED. The parameters of the laser are selected so that the laser interacts with the gallium semiconductor layer in a desired manner to yield the desired surface properties. For example, if a particular surface roughness is desired, the power of the laser light is selected so that the laser light penetrates the gallium semiconductor layer to a depth matching the desired surface roughness. The same principles can also be applied in a process that creates features such as trenches, pits, lenses, and mirrors on the gallium semiconductor layer of an LED. The laser projector is operated to irradiate a region of the gallium semiconductor layer to create a region of metallic gallium. The desired surface roughness and the different features can advantageously improve the beam collimation, light extraction, and other properties of the LED.

20 Claims, 12 Drawing Sheets

Related U.S. Application Data division of application No. 16/395,085, filed on Apr. 25, 2019, now Pat. No. 10,862,002.

(60) Provisional application No. 62/663,706, filed on Apr. 27, 2018.

(51) Int. Cl.
  *B23K 26/352* (2014.01)
  *H01L 33/30* (2010.01)
  *H01L 33/32* (2010.01)
  *H01L 33/44* (2010.01)
  *H01L 33/46* (2010.01)

(52) U.S. Cl.
  CPC .......... *H01L 33/0075* (2013.01); *H01L 33/30* (2013.01); *H01L 33/32* (2013.01); *H01L 33/44* (2013.01); *H01L 33/46* (2013.01); *H01L 2933/0025* (2013.01)

(58) Field of Classification Search
  USPC .......................................................... 438/29
  See application file for complete search history.

(56) References Cited

U.S. PATENT DOCUMENTS

| | | |
|---|---|---|
| 2004/0119082 A1 | 6/2004 | Sugawara |
| 2005/0082562 A1 | 4/2005 | Ou et al. |
| 2005/0139840 A1 | 6/2005 | Lai et al. |
| 2005/0227379 A1 | 10/2005 | Donofrio |
| 2008/0087909 A1 | 4/2008 | Weisbuch et al. |
| 2008/0121910 A1* | 5/2008 | Bergmann ........ H01L 21/02395 257/E31.13 |
| 2008/0258165 A1 | 10/2008 | Zimmerman et al. |
| 2009/0039367 A1 | 2/2009 | Iso et al. |
| 2009/0242929 A1 | 10/2009 | Lin |
| 2010/0032701 A1 | 2/2010 | Fudeta |
| 2010/0148197 A1* | 6/2010 | Bour .................... H01L 21/268 257/E33.074 |
| 2010/0151602 A1 | 6/2010 | Knollenberg et al. |
| 2011/0143466 A1 | 6/2011 | Chen et al. |
| 2011/0155999 A1 | 6/2011 | Tansu et al. |
| 2011/0227037 A1 | 9/2011 | Su |
| 2012/0292650 A1 | 11/2012 | Sugiyama et al. |
| 2013/0032846 A1* | 2/2013 | Lin ..................... H01L 33/62 438/26 |
| 2013/0082280 A1 | 4/2013 | Lin et al. |
| 2013/0082290 A1 | 4/2013 | Yan et al. |
| 2014/0014998 A1 | 1/2014 | Ohno |
| 2014/0131734 A1* | 5/2014 | Ting ...................... H01L 33/025 257/76 |
| 2014/0134775 A1* | 5/2014 | Yang ...................... H01L 33/12 438/47 |
| 2014/0141555 A1* | 5/2014 | Lowgren ................ H01L 33/62 977/762 |
| 2016/0155902 A1* | 6/2016 | Lunev ..................... H01L 33/42 428/670 |
| 2016/0260869 A1* | 9/2016 | Jeon ...................... H01L 33/38 |
| 2017/0047481 A1 | 2/2017 | Bonar et al. |
| 2017/0162745 A1* | 6/2017 | Moriyasu ................ H01L 33/44 |
| 2017/0170364 A1* | 6/2017 | Jeon ....................... H01L 33/38 |
| 2017/0186917 A1* | 6/2017 | Jeon ....................... H01L 33/08 |
| 2017/0236974 A1 | 8/2017 | Malinverni et al. |
| 2018/0026157 A1* | 1/2018 | Gaska ............... H01L 21/02496 257/753 |
| 2018/0083170 A1 | 3/2018 | Shepherd |

FOREIGN PATENT DOCUMENTS

| | | |
|---|---|---|
| JP | 2007149988 A | 6/2007 |
| JP | 2008503900 A | 2/2008 |
| JP | 2008124411 A | 5/2008 |
| JP | 2011211082 A | 10/2011 |
| JP | 2016506634 A | 3/2016 |

OTHER PUBLICATIONS

International Preliminary Report on Patentability for International Application No. PCT/US2019/029590, dated Nov. 5, 2020, 10 Pages.
International Search Report and Written Opinion for International Application No. PCT/US2019/029590, dated Sep. 24, 2019, 14 Pages.
Office Action dated Jan. 10, 2023 for Japanese Patent Application No. 2020-555779, filed on Dec. 10, 2020, 8 pages.

* cited by examiner

LED SURFACE MODIFICATION WITH ULTRAVIOLET LASER

CROSS REFERENCE TO RELATED APPLICATIONS

This application is a continuation of co-pending U.S. application Ser. No. 17/090,870, filed Nov. 5, 2020, which is a divisional application of U.S. application Ser. No. 16/395,085, filed Apr. 25, 2019, which claims the benefit of U.S. Provisional Patent Application No. 62/663,706, filed Apr. 27, 2018, which is incorporated by reference in its entirety.

BACKGROUND

The present disclosure relates to the manufacture of light-emitting diodes.

Displays are ubiquitous and are a core component of many wearable electronic devices, smart phones, tablets, laptops, desktops, TVs, and other display systems. Many displays include an array of light-emitting diodes (LEDs). LEDs can be manufactured by growing a semiconductor layer on a substrate. However, traditional methods for manufacturing LEDs may yield LEDs with inadequate light extraction or beam collimation.

SUMMARY

Embodiments relate to improving the light extraction properties of LEDs. For example, a laser light may be used to modify the light emitting face and nearby regions of a gallium semiconductor layer of an LED to improve light extraction efficiency of the LED. The gallium semiconductor layer refers to an epitaxial layer of the LED that includes gallium-based material. The gallium semiconductor layer may be a cladding layer of the LED, a first side of the gallium semiconductor layer facing an active layer (e.g., multi-quantum wells) that emits light, or a second side of the gallium semiconductor layer opposite the first side including a light emitting face of the LED.

The gallium semiconductor layer responds to a laser light, such as an ultraviolet (UV) laser light, by locally absorbing the light and separating into metallic gallium and a gas. The metallic gallium may be easily removed from the LED using a cleaning process (e.g., an acid clean), or may be kept on the LED to serve as a mirror feature for enhancing light extraction. The gas (e.g., $N_2$ when the gallium semiconductor layer includes GaN) evaporates away from the LED. A laser projector projects the laser light onto the (e.g., light emitting) surface of the gallium semiconductor layer to achieve desired surface properties for the gallium semiconductor layer. When the laser light is projected onto the gallium semiconductor layer, the laser light ablates the surface of the gallium semiconductor layer to form a layer of metallic gallium. In one embodiment, the laser light is projected onto the gallium semiconductor layer as part of a laser lift-off process that separates the LED from a growth substrate on which the LED was grown.

The parameters of the laser light are selected so that the laser interacts with the gallium semiconductor layer in a desired manner to yield the desired surface properties. For example, if a particular surface roughness is desired, the power of the laser light is selected so that the laser light penetrates the gallium semiconductor layer to a depth matching the desired surface roughness. A laser light with a lower power penetrates to a shallower but more uniform depth to create a thinner but smoother of metallic gallium, while a laser light with a higher power penetrates to a deeper and less uniform depth to create a thicker and rougher of metallic gallium. After the laser light is projected onto the surface of the gallium semiconductor layer, the layer of metallic gallium is removed to expose a surface with the desired surface roughness.

Different levels of surface roughness for the light emitting surface provide for different advantages. For example, a smoother surface (created with a laser light having a lower power) can improve the collimation of the LED's light output. Meanwhile, a rougher surface (created with a laser light having a higher power) improves the LED's light extraction efficiency. For example, a flat surface provides a critical angle for directionalized light to be transmitted through the light emitting face to increase collimation but decrease extraction of light, while a rougher surface includes multiple critical angles for transmission of directionalized light to increase extraction of light but decrease collimation. Thus, the roughness of the light emitting face may be adjusted to achieve desired extraction efficiency and collimation.

The transformation of the gallium semiconductor layer using laser light can also be applied in a process that creates features such as trenches, pits, lenses, and mirrors on the light emitting face of the gallium semiconductor layer of an LED. The laser projector is operated to irradiate a region of the gallium semiconductor layer to create a region of metallic gallium. To create a mirror feature, the metallic gallium that is created by irradiating the gallium semiconductor layer is kept on the gallium semiconductor layer. The metallic gallium acts as a mirror that reflects the light emitted by the LED. The mirror feature can be shaped to reflect light in a manner that improves beam collimation or light extraction. For example, an annular mirror feature (i.e., an annular region of metallic gallium) improves beam collimation by reflecting light beams that would otherwise be emitted from the LED at relatively wide angles.

Features such as trenches and pits can be etched into the gallium semiconductor layer of an LED by irradiating a region of the gallium semiconductor layer and then removing the metallic gallium that is created. For example, a circular trench feature can be etched into the gallium semiconductor layer by irradiating a ring-shaped region and removing the ring-shaped region of metallic gallium. The circular trench feature can concentrate the light extraction of the LED into the circular region enclosed by the trench.

Lens features can be created etching a concave pit into the gallium semiconductor layer and then depositing a coating with a relatively high refractive index onto the gallium semiconductor layer. As a result, one side of the coating is in contact with the gallium semiconductor layer, so the portion in contact with the concave pit has a convex surface. The coating can be applied so that the other surface is either planar or convex (or some other shape). If the other side is planar, then the coating forms a plano-convex lens feature. If the other side is convex, then the coating forms a bi-convex lens feature. Lens features that are created in this manner can similarly improve the light extraction and beam collimation of the LED.

The figures depict embodiments of the present disclosure for purposes of illustration only.

DETAILED DESCRIPTION

System for LED Display Fabrication

Figure 1:
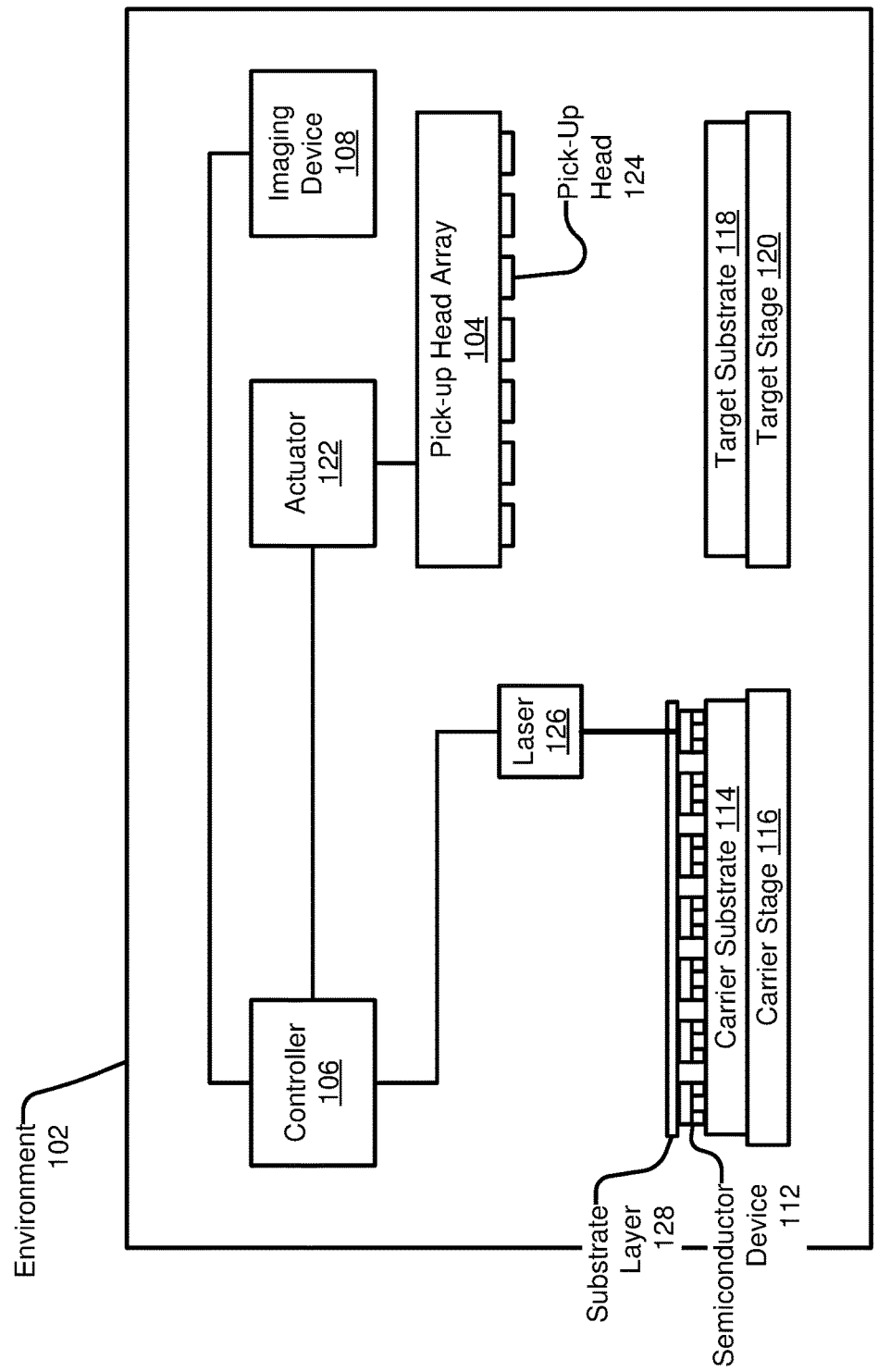
FIG. 1 is a system diagram illustrating a display assembly system, in accordance with one embodiment.

FIG. 1 is a system diagram illustrating a display assembly system 100, in accordance with one embodiment. The system 100 fabricates a display device by assembling semiconductor devices 112 onto a target substrate 118. In some embodiments, the semiconductor devices 112 are different color light emitting diode (LED) dies. The carrier substrate 114 may be a carrier film that holds the semiconductor devices 112 for pick up by the pick-up head array 104.

The target substrate 118 may be a display substrate, or may be an intermediate carrier substrate that facilitates bonding with a display substrate. The system 100 places LEDs at pixel locations of the display substrate, and then bonds the LEDs to the display substrate. In some embodiments, the semiconductor devices 112 are microLEDs having a reduced divergence of light output and small light emitting area is comparison to conventional LEDs.

The system 100 includes an environment 102 for picking and placing semiconductor devices 112. Within the environment 102, the system 100 further includes a pick-up head array 104, an imaging device 108, an actuator 122, a carrier stage 116, a target stage 120, and a laser projector 126 located within the environment 102. In some embodiments, the environment 102 is an interior environment of a SEM chamber and the imaging device 108 is a scanning electron microscope (SEM).

The carrier stage 116 holds a carrier substrate 114 having semiconductor devices 112. The target stage 120 holds a target substrate 118 to receive some or all of the semiconductor devices 112 from the carrier substrate 114. A controller 106 is coupled to the imaging device 108 and the pick-up head array 104 (e.g., via the actuator 122) and controls the operations of the imaging device 108 and pick-up head array 104. For example, the controller 106 causes the pick-up head array 104 to pick up one or more semiconductor devices 112 located on a carrier substrate 114, and place the one or more semiconductor devices on the target substrate 118.

The pick-up head array 104 includes a plurality of pick-up heads 124. Each pick-up head 124 can pick up a semiconductor device 112 from the carrier substrate 114, and place the semiconductor device on the target substrate 118. After picking up a semiconductor device 112, the pick-up head 124 is aligned with a location on the target substrate 118. The pick-up head 124 is then separated from the semiconductor device 112 after placing the semiconductor device 112 at the location on the target substrate 118.

The actuator 122 is an electro-mechanical component that controls the movement of the pick-up head array 104 based on instructions from the controller 106. For example, the actuator 122 may move the pick-up head array 104, or individual pick-up heads 124, with three degrees of freedom including up and down, left and right, and forward and back. In various embodiments, the actuator 122 may be, for example, a rotating motor, a linear motor, or a hydraulic cylinder.

The imaging device 108 facilitates a visual alignment for semiconductor device pick-up from the carrier substrate 114, and alignment for semiconductor device placement on the target substrate 118. For example, the imaging device 108 generates images of the pick-up head array 104 and the carrier substrate 114, and provides the images to the controller 106. The controller 106 aligns the one or more pick-up heads 124 of the pick-up head array 104 with the carrier substrate 114 based on the images, and picks up one or more semiconductor devices 112 mounted on the carrier substrate 114. As another example, the imaging device 108 generates images of the one or more pick-up heads 124 of the pick-up head array 104 and the target substrate 118, and provides the images to the controller 106. The controller 106 aligns the one or more pick-up heads 124 with the display substrate 118 based on the images, and places the semiconductor devices 112 attached to the one or more pick-up heads 124 on the display substrate 118.

In some embodiments, the imaging device 108 is an environmental scanning electron microscope (ESEM) to provide images without specimen coating. In these embodiments, the environment 102 is an ESEM chamber including a high pressure atmosphere of water vapor. The use of an SEM is advantageous for picking and place small semiconductor device, such as micro-LED dies. In various embodiments, other types of imaging devices may be used to facilitate the alignments.

In some embodiments, the carrier stage 116 and/or target stage 120 can be adjusted to facilitate precision alignment with the pick-up head array 104. For example, the carrier stage 116 and/or target stage 120 may include three degrees of freedom. The degrees of freedom may include left and right, backward and forward, and a yaw rotational degree of freedom. The carrier substrate 114 is moved with the carrier stage 116, and the display substrate 118 is moved with the target stage 120.

The system 100 may include one or more carrier substrates 114. For example, different carrier substrates 114 may carry different color LED dies. A carrier substrate 114 may be carrier film that holds singulated semiconductor devices 112 for transfer to the display substrate 118. The system may include one or more target substrates 118. In some embodiments, such as when the target substrate 118 is the display substrate for receiving the semiconductor devices 112, the target stage 120 includes a heater for thermal conductive bonding of the electrical contact pads of the semiconductor devices 112 to the display substrate 118 subsequent to placement of the semiconductor devices 112 on the display substrate 118 by the pick-up head 124. In other embodiments, the target substrate 118 is an intermediate carrier substrate that is used to facilitate direct bonding of the semiconductor devices 112 with a separate display substrate 118 (e.g., using a direct bonding process).

In some embodiments, the system 100 includes multiple pick-up head arrays 104 each positioned at a separate station. Each station may be dedicated to the pick and place of a particular color LED, such as a green station for green LEDs, a red station for red LEDs, and a blue station for blue LEDs, etc.

As discussed above, in some embodiments, the semiconductor devices 112 are microLEDs (hereinafter referred to as µLEDs). As described herein, a µLED is a particular type of LED having a small active light emitting area (e.g., less than 2,000 $\mu m^2$) and collimated light output. The collimated light output increases the brightness level of light emitted from the small active light emitting area. While this application discusses primarily µLEDs, in other embodiments the semiconductor devices 112 may comprise any semiconductor device having a gallium semiconductor layer, including semiconductor devices including gallium-based epitaxial layers grown on substrates.

In some embodiments, the feature size of a µLED (e.g., the diameter) may range from sub-micrometers to tens of micrometers (e.g., from 0.1 µm to 10 µm). The µLED may be one of many LEDs of an array on a target substrate, with the pitch (e.g., spacing between µLEDs) ranging from sub-micrometers to tens of micrometers.

Each of the semiconductor devices 112 may be formed on a substrate layer 128. The substrate layer 128 may be a transparent substrate, such as a glass substrate or a sapphire substrate. In some embodiments, the substrate layer 128 is formed of a material that is not optically transparent, such as gallium arsenide (GaAs), but is substantially transparent to a different wavelength range (e.g., IR range). In some embodiments, the semiconductor devices 112 are formed on the substrate layer 128 by growing a gallium semiconductor layer on the substrate layer 128. Here, the gallium semiconductor layer is an epitaxial layer on the substrate layer 128. In some embodiments, the semiconductor devices 112 are placed onto the carrier substrate 114 where they are held to facilitate detaching the substrate layer 128 from the semiconductor devices 112.

The laser projector 126 is used to detach the substrate layer 128 from the semiconductor devices 112 by exposing a surface of the semiconductor devices 112 adjacent to the substrate layer 128 to a laser light. The process of using the laser projector 126 to detach the substrate layer 128 is referred to herein as a laser lift-off (LLO) operation. In some embodiments, the laser projector 126 is configured to project a laser light that is able to pass through the substrate layer 128 and be absorbed by the gallium semiconductor layer of the semiconductor devices 112. For example, the laser projector 126 may project a pulse ultraviolet laser that is able to pass through a sapphire substrate layer 128 to be absorbed by the gallium semiconductor layer of the semiconductor devices 112. In other embodiments, where the substrate layer 128 comprises gallium arsenide, the laser projector 126 projects an IR laser. Absorption of the laser light projected by the laser projector 126 causes a portion of the gallium semiconductor layer to separate into its component elements and weakens the bond between the gallium semiconductor layer of the semiconductor devices 112 and the substrate layer 128, allowing for the semiconductor devices 112 and the substrate layer 128 to be separated.

In some embodiments, the laser projector 126, instead of being configured to project a laser through the substrate layer 128, projects the laser at a junction of the substrate layer 128 and the gallium semiconductor layer of the semiconductor devices 112. As such, the projected laser may not need to pass through the substrate layer 128. In these embodiments, the substrate layer 128 may comprise a material not substantially transparent to the laser projected by the laser projector 126.

In some embodiments, another laser (not shown) generates a laser light to singulate the semiconductor devices 112 on the carrier substrate 114. Multiple semiconductor devices 112 may be fabricated on a native substrate (e.g., the substrate layer 128) and singulated on the carrier substrate 114. In some embodiments, the laser light is directed through the carrier substrate 114. The carrier substrate may include a carrier tape or other adhesive layer to hold the semiconductor devices 112 in place with an adhesion force. In some embodiments, the laser light reduces the adhesion force to facilitate pick up of the semiconductor devices 112 by the pick-up head array 104. In some embodiments, the system 100 includes a mechanical dicer to singulate the semiconductor devices 112, such as a diamond based cutting wheel.

In some embodiments, the controller 106, in addition to controlling an alignment of the pick-up heads 124 of the pick-up head array 104 (e.g., using actuators 122), may also control a temperature of the environment 102. In some embodiments, the controller 106 may alter the temperature of the environment 102 to change a temperature of the semiconductor devices 112. For example, the controller 106 may operate one or more heating coils (not shown) in the environment 102 to raise a temperature of the semiconductor devices 112. In other embodiments, the carrier stage 116 or other component may contain a heater able to directly heat one or more of the semiconductor devices 112. In some embodiments, the temperature of the environment 102 is controlled using a separate temperature controller (not shown).

MicroLED Structure

Figure 2A:
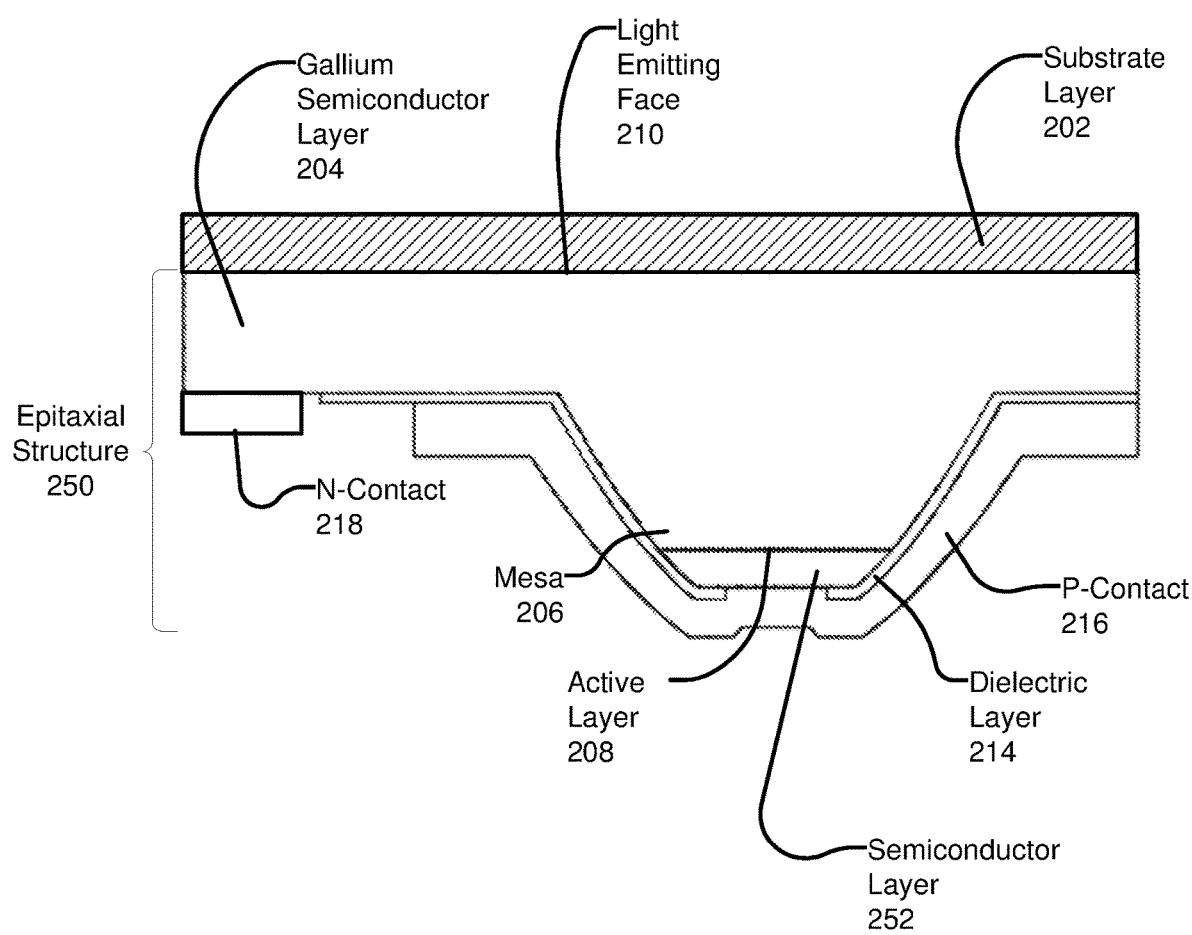
FIGS. 2A, 2B, and 2C illustrate schematic cross sections of a microLED (µLED), in accordance with one embodiment.
Figure 2B:
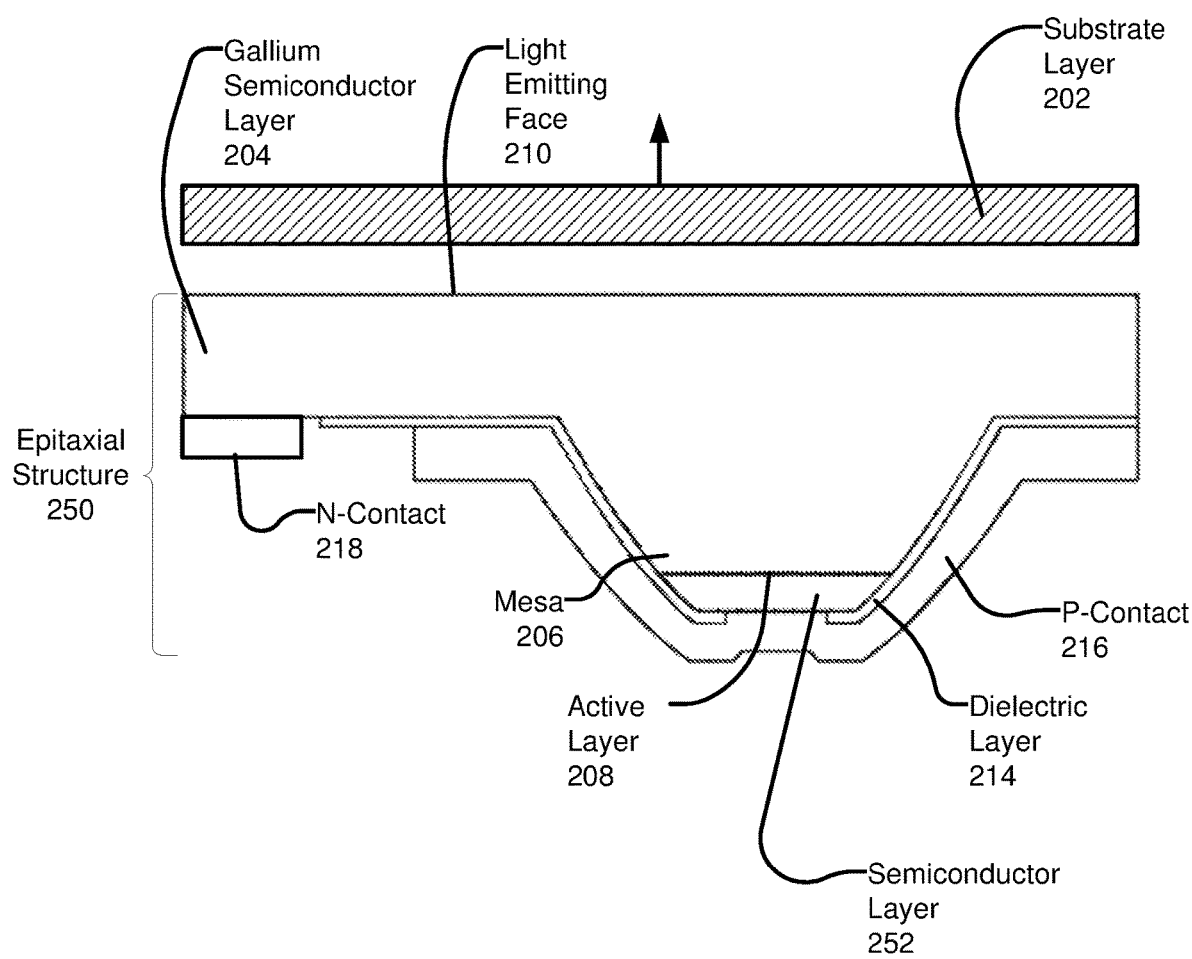
Figure 2C:
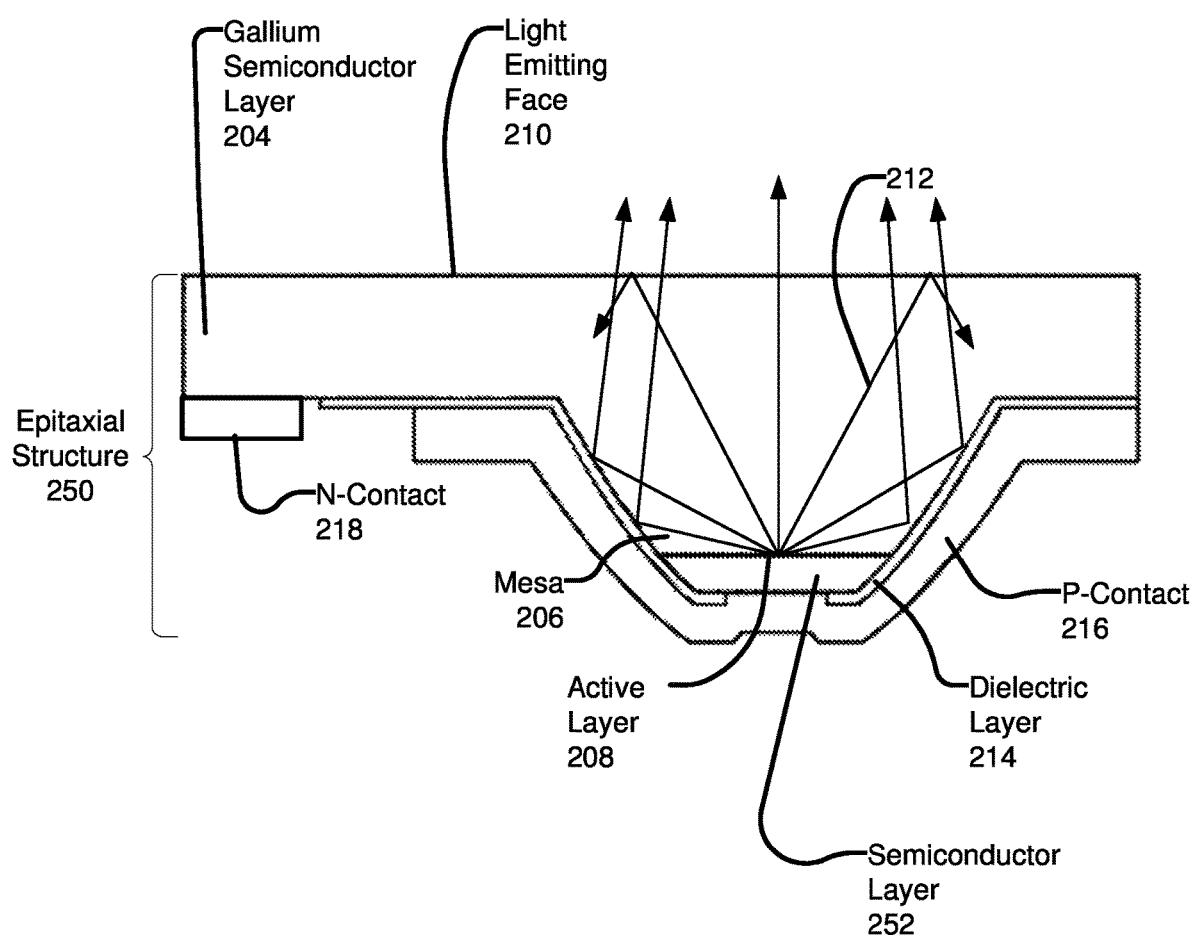

FIGS. 2A-2C illustrate schematic cross sections of a µLED 200, in accordance with one embodiment. The µLED 200 is an example of an LED that may be positioned on a surface of a display substrate (e.g., target substrate 118) to emit collimated visible or invisible light.

Referring first to FIG. 2A, the µLED 200 includes an epitaxial structure 250 on a substrate layer 202 (which may correspond to the substrate layer 128 illustrated in FIG. 1). The epitaxial structure 250 includes a gallium semiconductor layer 204 that is grown on the substrate layer 202, an active layer 208 grown on the substrate layer 202, and another semiconductor layer 252 grown on the active layer 208. In some embodiments, the gallium semiconductor layer 204 is an n-type semiconductor layer while the semiconductor layer 252 is a p-type semiconductor layer. Although not shown in FIG. 2A, the gallium semiconductor layer 204 may include a current confinement layer and a current spreading layer. Furthermore, the semiconductor layer 252, which may be gallium-based or otherwise, may include a current confinement layer and a contact layer to connect with the p-contact 216. In other embodiments, the semiconductor layer 204 is a p-type semiconductor layer and the semiconductor layer 252 is an n-type semiconductor layer. Here, the p-contact 216 is an n-contact and the n-contact 218 is a p-contact. The gallium semiconductor layer 204 includes a light emitting face 210, and may be formed of a semiconductor material including gallium such as gallium nitride (GaN), gallium phosphide (GaP), or gallium arsenide (GaAs).

Furthermore, a dielectric layer 214 is disposed on the gallium semiconductor layer 204, a p-contact 216 is disposed on a first portion of the dielectric layer 214, and an n-contact 218 is disposed on a second portion of the gallium semiconductor layer 204.

As illustrated in FIG. 2B, the substrate layer 202 may be removed from the surface of the gallium semiconductor layer 204 of the µLED 200 to reveal a light emitting face 210 of the µLED 200. In some embodiments, the substrate layer 202 is separated from the gallium semiconductor layer 204 using a laser lift-off (LLO) process.

The µLED 200 may be less than 20 µm in diameter with a parabolic structure etched onto the LED die during wafer processing to form a quasi-collimated light beam emerging from the light emitting face 210. The µLED 200 has relatively high light extraction efficiency and outputs quasi-collimated light because of its shape.

In some embodiments, the epitaxial structure 250 is shaped into a mesa 206. An active (or light emitting) layer 208 (or "active light emitting area") is included in the structure of the mesa 206. The mesa 206 has a truncated top, on a side opposed to the light transmitting or emitting face 210 of the µLED 200. The mesa 206 also has a near-parabolic shape to form a reflective enclosure for light generated within the µLED 200.

FIG. 2C illustrates the µLED 200 after removal of the substrate layer 202. Upon removal of the substrate layer 202, the µLED 200 may be placed on a display substrate (not shown), and operated to emit light. The arrows 212 show how light emitted from the active layer 208 is reflected off the p-contact 216 and internal walls of the mesa 206 toward the light emitting face 210 at an angle sufficient for the light to escape the µLED 200 (i.e., within an angle of total internal reflection). The p-contact 216 is reflective for the light emitted from the active layer 208. At least a portion of the light emitted from the active layer 208 travels through the semiconductor layer 252, where it is reflected by the p-contact 216, and transmitted back through the semiconductor layers 252 and 204 to the light emitting face 210. The parabolic shape of the mesa 206 results in the reflected light being collimated, and improves extraction efficiency by directing the light to be incident at the light emitting face 210 within a critical angle of the light emitting face 210. During operation, the p-contact 216 and the n-contact 218 connect the µLED 200 to the display substrate (not shown).

As discussed above, the substrate layer 202 may correspond to a glass or sapphire substrate. In one embodiment, the epitaxial structure 250 includes a p-doped gallium nitride (GaN) layer (e.g., semiconductor layer 252), an n-doped GaN layer 204 (e.g., semiconductor layer 204), and further includes the active layer 208 between the p-doped and n-doped GaN layers. The active layer 208 may include a multi-quantum well structure. The substrate layer 202 is transparent to a laser light projected by the laser projector 126, which may be applied through the substrate layer 202 to the gallium semiconductor layer 204. In another embodiment, the substrate layer 202 comprises a gallium compound, as such gallium arsenide (GaAs). In this embodiment, the gallium semiconductor layer 204 includes a p-doped GaAn layer, an n-doped GaAs layer, and further includes the active layer 208 between the p-doped and n-doped GaAs layers. In some embodiments, the µLED 200 includes a gallium phosphide (GaP) substrate 202 for increased transparency relative to GaAs, such as for red visible LEDs. In some embodiments, the substrate layer 202 is a semiconductor substrate, such as a silicon substrate. When a non-transparent substrate layer 202 is used, the laser light from the laser projector 126 may be applied at the interface of the substrate layer 202 and the gallium semiconductor layer 204 to separate the layers.

Figure 3:
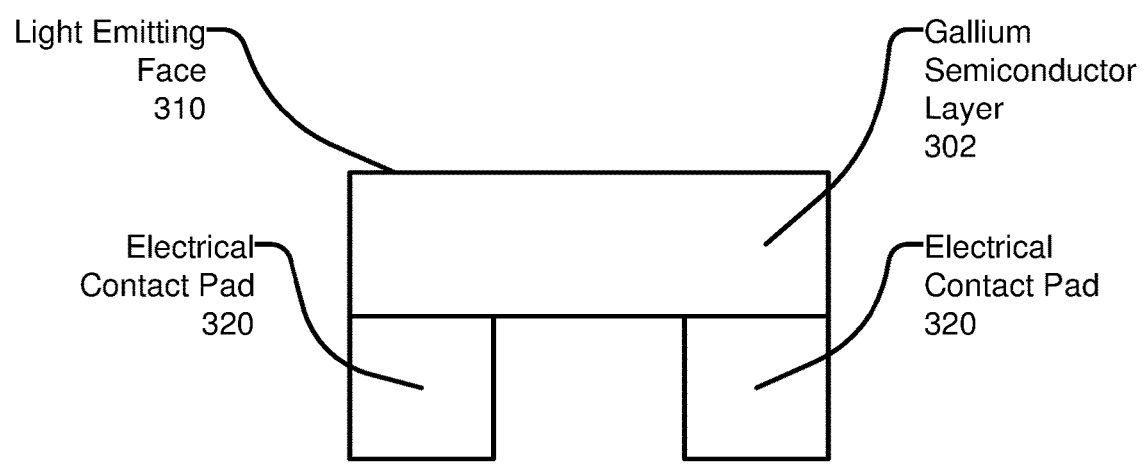
FIG. 3 illustrates a simplified schematic diagram of the µLED, in accordance with one embodiment.

FIG. 3 illustrates a simplified schematic diagram of a µLED 300, in accordance with some embodiments. The µLED 300 may correspond to the µLED 200 illustrated in FIGS. 2A-2C. The µLED 300 as illustrated in FIG. 3 comprises a gallium semiconductor layer 302 having a light emitting face 310. In addition, the µLED 300 comprises a pair of electrical contact pads 320, which may correspond to the n-contact 218 and the p-contact 216 illustrated in FIGS. 2A-2C.

Controlling Laser Parameters to Achieve Desired Surface Roughness

As noted above, a laser projector can be used to perform a laser lift-off operation to separate the substrate layer from the surface of the gallium semiconductor layer. The laser projector may additionally or alternatively be used to modify the surface of the gallium semiconductor layer (e.g., the light emitting face) to achieve desired surface properties, such as a desired roughness. The roughness of a surface refers to a measure of deviations in the direction of normal vectors to the surface relative to an ideal flat surface. Larger deviations correspond with a rougher surface, while smaller deviations correspond with a smoother surface. Various parameters of the laser light, such as power and dot-to-dot pitch, can be adjusted so that the laser light interacts with the gallium semiconductor layer in a different manner, which in turn yields a surface with different properties. The laser modification of the gallium semiconductor layer to achieve desired surface properties can be performed in connection with the LLO process for separating the substrate layer from the gallium semiconductor layer and exposing the light emitting face. In another example, separate applications of laser light may be used to separate the substrate layer and form the desired surface properties.

Figure 4:
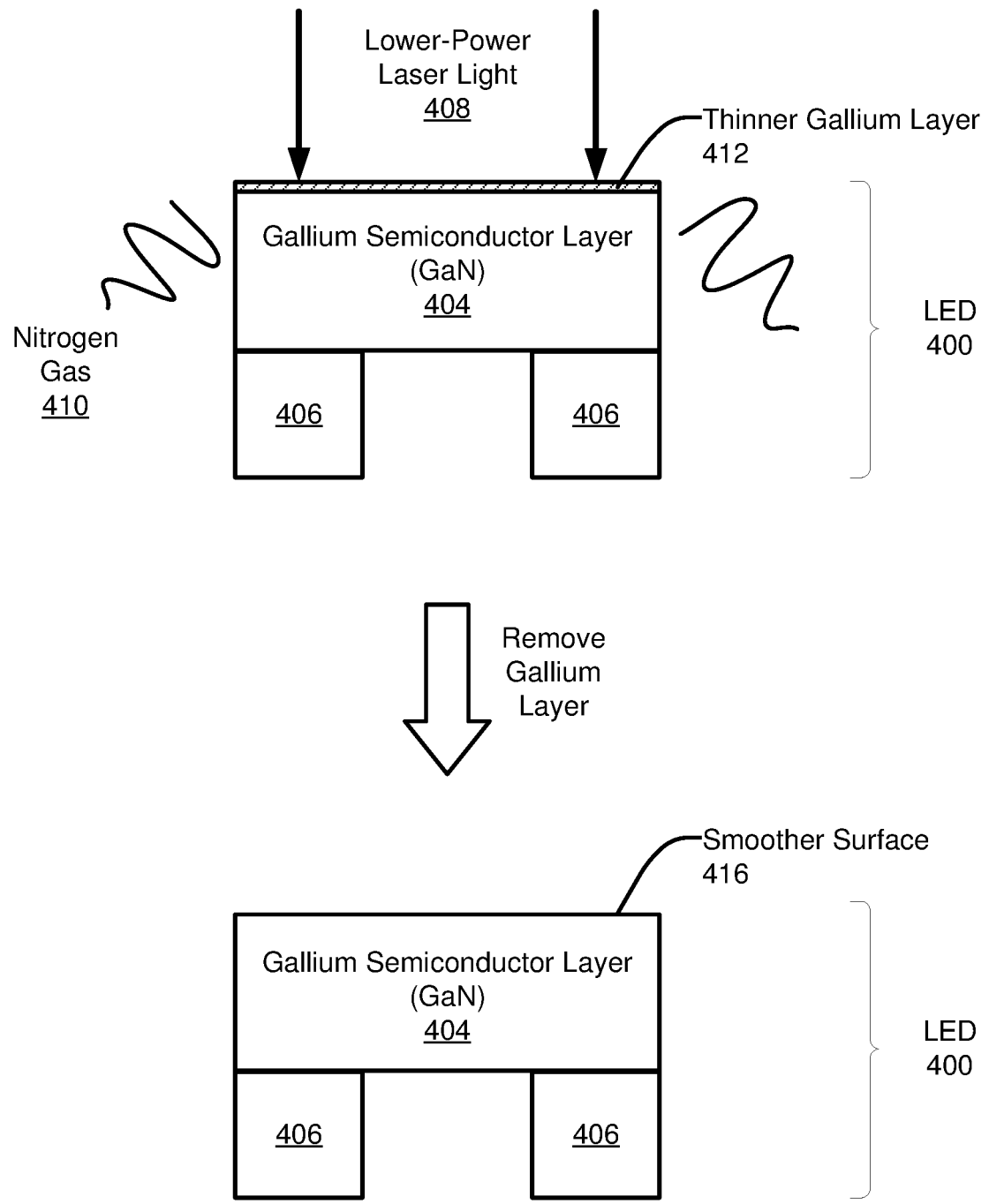
FIG. 4 illustrates an operation in which a lower-power laser is used to create a smoother surface on a gallium semiconductor layer, in accordance with one embodiment.

FIG. 4 illustrates an operation in which a lower-power laser light 408 is used to create a smoother surface on a gallium semiconductor layer 404 of a µLED 400, in accordance with one embodiment. In the operation shown in FIG. 4, the laser light 408 corresponds to laser light emitted by the laser projector 126 shown in FIG. 1, and the gallium semiconductor layer 404 corresponds to the gallium semiconductor layers 204, 302 shown in FIGS. 2A-2C and FIG. 3, respectively.

In some embodiments, the gallium semiconductor layer 404 is a gallium semiconductor compound. For instance, the gallium semiconductor layer 404 is gallium nitride (GaN) in the embodiment shown in FIG. 4. In other embodiments, the gallium semiconductor layer 404 is a different gallium semiconductor compound, such as gallium arsenide (GaAs) or gallium phosphide (GaP). In some embodiments, the type of gallium compound forming the substrate of the µLED 400 is based upon the type of µLED. The µLED 400 further comprises a pair of electrodes 406 formed on a surface of the gallium semiconductor layer 404 opposite from the substrate layer. The electrodes 406 correspond to the electrical contact pads 320 shown in FIG. 3 or the p-contact 216 and the n-contact 218 shown in FIGS. 2A-2C.

In the operation shown in FIG. 4, the parameters of the laser light (not shown in FIG. 4) have been adjusted so that the laser projector emits a laser light 408 with lower power. The laser light 408 is projected onto the gallium semiconductor layer 404, which absorbs at least a portion of the laser light 408. In one embodiment, the operation is performed as part of a laser lift-off operation, in which case the laser light 408 is projected through a growth substrate on which the gallium semiconductor layer was grown (e.g., the substrate layer 128 or 202 shown in FIGS. 1 and 2A-2C, respectively) while the gallium semiconductor layer is still attached to the growth substrate. In this embodiment, the growth substrate (not shown in FIG. 4) is formed of a material that is substantially transparent to the laser light 408 and thus does not absorb a significant portion of the laser light 408. For example, the laser light may be a pulsed ultraviolet (UV) laser light and the substrate layer may be a sapphire substrate. In another embodiment, the laser light 408 is projected toward a junction of the substrate layer and the gallium semiconductor layer 404 without passing through the substrate layer. In still another embodiment, the operation is performed after the substrate layer is removed.

The laser light 408 ablates the surface of the gallium semiconductor layer 404. For example, as illustrated in FIG. 4, the gallium nitride (GaN) material at the surface of the gallium semiconductor layer 404 breaks down into its component nitrogen and gallium elements upon exposure to the laser light 408. The nitrogen is released as nitrogen gas 410, leaving behind a gallium layer 412. Because the laser projector was configured to emit a lower-power laser light 408, the laser light 408 penetrates and ablates a relatively shallow portion of the gallium semiconductor layer 404. As a result, the gallium layer 412 is relatively thin and has a relatively uniform depth over the surface of the gallium semiconductor layer.

After the gallium layer 412 is formed, the operation continues by removing the gallium layer 412. For example, the gallium layer 412 may be heated to debond the gallium semiconductor layer 404 and the gallium layer 412, and then a cleaning process is performed to remove the gallium layer 412. The gallium layer 412 melts at a low temperature, around 40 degrees Celsius, such that a slight heating melts the gallium layer 412 and allows gallium layer 412 to be separated from the gallium semiconductor layer 404. In some embodiments, the heating is integrated with the LLO process for separating the substrate layer. For example, the gallium layer 412 may be heated to debond the gallium semiconductor layer 404 and the substrate layer. In one embodiment, the cleaning process that removes the gallium layer 412 is an acid wet etch (e.g., using hydrochloric acid). In another embodiment, the cleaning process is a dry etch. The removal of the gallium layer 412 leaves behind a smooth surface 416 because, as noted above, the lower-power laser light 408 yields a gallium layer 412 that is relatively thin and has a relatively uniform depth. The smoother surface is advantageous, for example, because it improves the collimation of the light output of the μLED 400.

Figure 5:
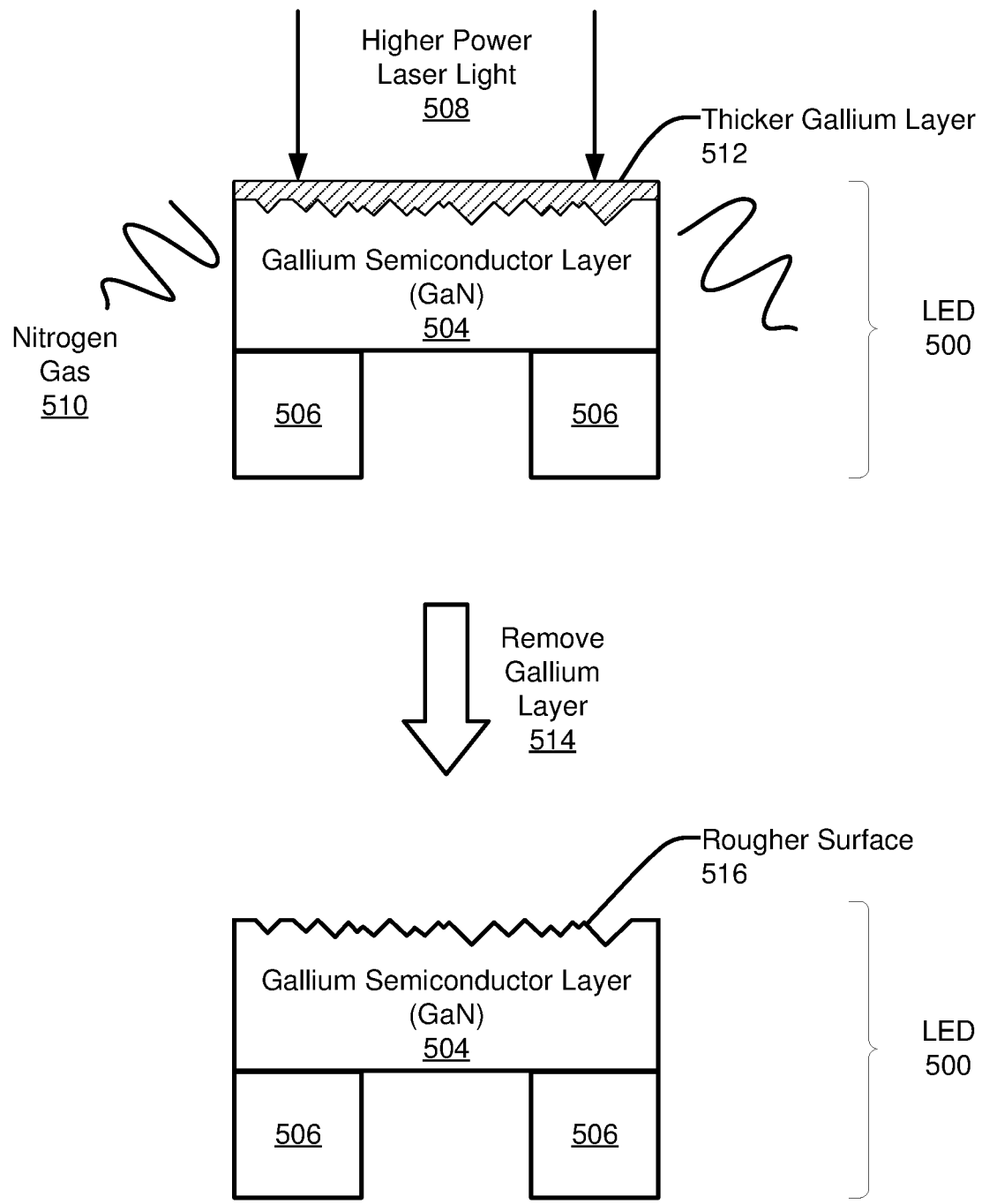
FIG. 5 illustrates an operation in which a higher-power laser is used to create a rougher surface on a gallium semiconductor layer, in accordance with one embodiment.

FIG. 5 illustrates an operation in which a higher-power laser light is used to create a rougher surface on a gallium semiconductor layer, in accordance with one embodiment. Similar to the operation shown in FIG. 4, the laser light 508 shown in FIG. 5 corresponds to laser light emitted by the laser projector 126 shown in FIG. 1, and the gallium semiconductor layer 504 corresponds to the gallium semiconductor layers 204, 302 shown in FIGS. 2A-2C and FIG. 3, respectively. Similarly, although the gallium semiconductor layer 504 is noted in FIG. 5 as gallium nitride (GaN), in other embodiments the gallium semiconductor layer 504 may instead be a different gallium semiconductor compound, such as gallium arsenide (GaAs) or gallium phosphide (GaP).

In the operation shown in FIG. 5, the parameters of the laser light (not shown in FIG. 4) have been adjusted so that the laser projector emits a laser light 508 with higher power. The laser light 508 is projected onto the gallium semiconductor layer 504 in the same manner as described above with respect to FIG. 4, and the laser light 508 ablates the surface of the gallium semiconductor layer 404 to break down the gallium semiconductor layer 504 into its component nitrogen 510 and gallium 512 elements. Because the laser projector was configured to emit a higher-power laser light 508, the laser light 508 penetrates and ablates a deeper portion of the gallium semiconductor layer 504. As a result, the layer of gallium 512 is thicker and has a less uniform depth over the surface of the gallium semiconductor layer 504.

After the metallic gallium layer 512 is removed 514, the resulting surface 516 of the gallium semiconductor layer 504 is rougher than the surface yielded by the lower-power operation shown in FIG. 4. A rougher surface 516 may be advantageous, for example, because it improves extraction efficiency and allows the LED to emit a larger proportion of the light that is generated. This may be useful when directionalized light output is desired for the LED, such as when multiple LEDs are used to form pixel elements of a high resolution display device.

Figure 6:
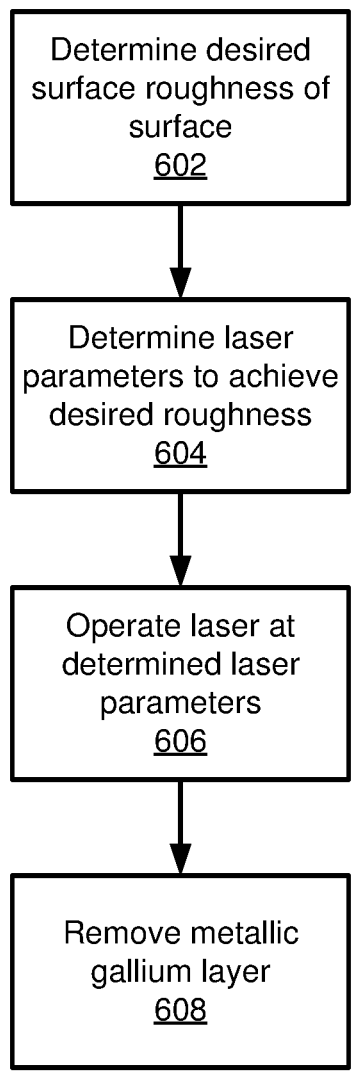
FIG. 6 is a flow chart illustrating a process for operating a laser to create a surface on a gallium semiconductor layer with a desired roughness, in accordance with one embodiment.

FIG. 6 is a flow chart illustrating a process 600 for operating a laser to create a surface on a gallium semiconductor layer with a desired roughness, in accordance with one embodiment. The process 600 may include different and/or additional steps, or some steps may be in different orders.

The process 600 includes determining 602 a desired surface roughness for the surface of the gallium semiconductor layer of an LED. The surface may be the light emitting face of the gallium semiconductor layer, or some other surface. The surface roughness is a measure of the deviations on the surface along the direction of the normal vector of the surface. For instance, larger deviations across the surface correspond to a rougher surface and a higher value for surface roughness, while smaller deviations across the surface correspond to a smoother surface and a lower value for surface roughness. The surface roughness may be quantified, for example, as an arithmetical mean deviation ($R_a$), which is the arithmetic mean of the absolute values of profile deviations from the mean line of the surface's roughness profile. In various embodiments, a smooth surface such as the surface 416 shown in FIG. 4 has an arithmetical mean deviation approximately $R_a$=5 nm (nanometers) (e.g., between 3 nm and 7 nm), whereas a rough surface such as the surface 516 shown in FIG. 5 has an arithmetical mean deviation of approximate than $R_a$=1000 nm (e.g., between 950 nm and 1050 nm). The surface roughness may alternatively be quantified as a root mean squared deviation (Rq) or with some other roughness parameter.

After determining 602 a desired surface roughness, the process 600 includes determining 604 laser parameters to achieve the desired surface roughness. In one embodiment, the process 600 selects a laser power that results in a laser light that penetrates the gallium semiconductor layer to the depth necessary to achieve the desired surface roughness. In other embodiments, the process 600 can additionally or alternatively determine values for other parameters of the laser light, such as dot-to-dot pitch. As referred to herein, dot-to-dot pitch is the distance between two adjacent pulses of the laser light in an embodiment where the laser light is projected onto the gallium semiconductor layer in a scanning pattern. When the laser light is projected in a scanning pattern, the roughness of the area covered by a single laser pulse depends on the power of the laser light, while the uniformity of the roughness across the gallium semiconductor layer depends on the dot-to-dot pitch. In some embodiments, the dot-to-dot pitch is selected so that adjacent pulses have substantially uniform overlap (i.e., different sets of adjacent pulses have approximately the same overlapping area), which results in an approximately uniform roughness across the gallium semiconductor layer. In other embodiments, the dot-to-dot pitch is selected so that the overlap is not substantially uniform, which increases local variation in the roughness of the surface.

The laser projector is operated 606 to project a laser light with the determined laser parameters. As described above with respect to FIGS. 4 and 5, the laser projector projects a laser light onto the gallium semiconductor layer, and the gallium semiconductor layer absorbs at least a portion of the laser light. In one embodiment, the laser light is projected in a scanning pattern onto the gallium semiconductor layer. The laser light ablates the surface of the gallium semiconductor layer to form a layer of metallic gallium on the surface of the gallium semiconductor layer. In some embodiments, the laser projector is operated in connection with a LLO process to separate the substrate layer. In other embodiments, the LLO process or some other process is used to remove the substrate layer, and then the laser projector is operated to form the layer of metallic gallium. After operating 606 the laser projector to form the metallic gallium layer, the metallic gallium layer is removed 608 to expose a surface with the desired surface roughness, such as the light emitting face of the LED.

Although the examples shown in FIGS. 4 and 5 illustrate this process 600 being performed on the light emitting surface of an LED 400, 500, the process 600 may additionally or alternatively be performed on the sides or edges of an LED. In other embodiments, the process 600 may also be performed to achieve a desired surface roughness on other types of semiconductor devices.

Controlling Laser Parameters to Create Features

Figure 7A:
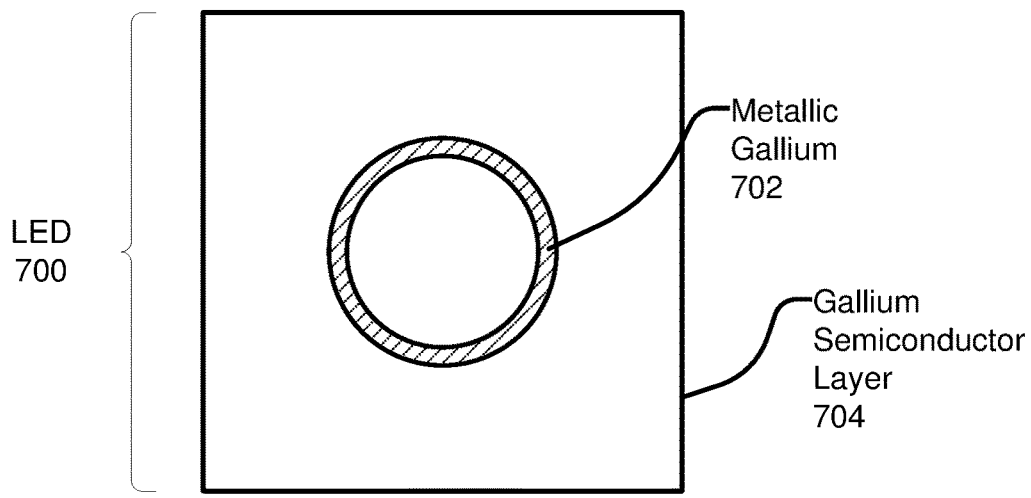
FIGS. 7A, 7B, and 7C illustrate an example of a circular trench feature that can be etched into a gallium semiconductor layer, in accordance with one embodiment.
Figure 7B:
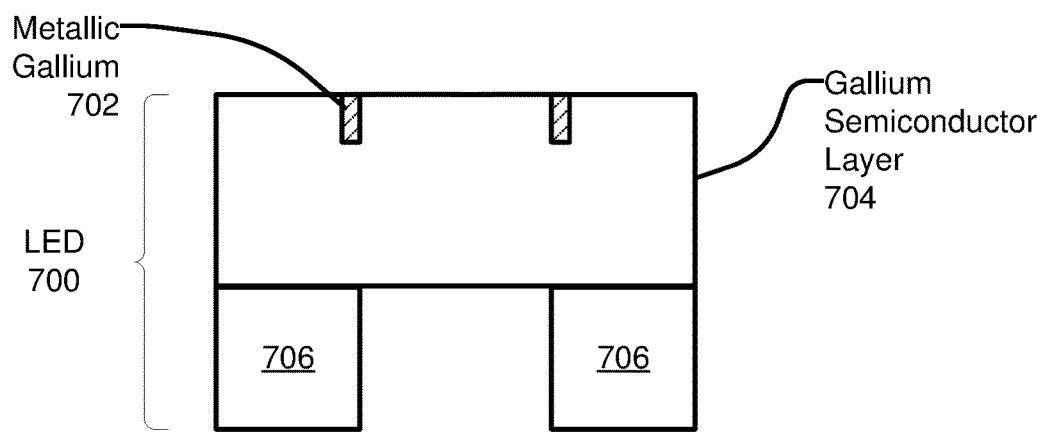
Figure 7C:
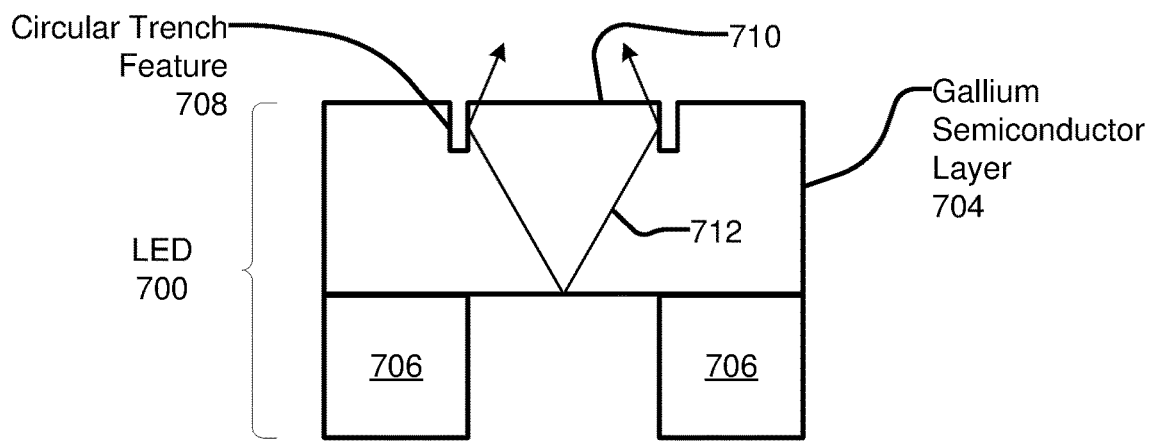

The principles described above with respect to FIGS. 4-6 can also be used to create features such as trenches, pits, lenses, and mirrors on the gallium semiconductor layer of an LED. FIGS. 7A-7C illustrate an LED 700 with a circular trench feature 708 that is etched into its gallium semiconductor layer from the light emitting face, in accordance with one embodiment. Similar to the LEDs described above, the LED 700 includes a gallium semiconductor layer 704 and contact pads 706. As noted above, the gallium semiconductor layer 704 is formed of a gallium semiconductor compound such as gallium nitride (GaN), gallium arsenide (GaAs), or gallium phosphide (GaP).

The circular trench feature 708 is etched into the light emitting face of the gallium semiconductor layer 704 by irradiating a ring-shaped region of the gallium semiconductor layer 704 and then removing the resulting layer of metallic gallium 702. The irradiation from the laser projector ablates the ring-shaped region in the same manner as described above and forms a layer of metallic gallium 702 in the ring-shaped region, as shown in the top and side views in FIGS. 7A and 7B, respectively. For example, in an embodiment where the gallium semiconductor layer 704 is formed of gallium nitride (GaN), the irradiation causes the gallium nitride (GaN) material in the irradiated region to break down into nitrogen gas and metallic gallium.

After the ring-shaped region is irradiated to form the ring of metallic gallium 702, the metallic gallium is removed to yield the circular trench feature 708 in the gallium semiconductor layer 704, as shown in FIG. 7C. The parameters of the laser light can be selected so that the irradiation penetrates the gallium semiconductor layer 704 to a desired depth, which yields a ring of metallic gallium of a particular thickness. As a result, the circular trench feature 708 has a similar depth after the metallic gallium 702 is removed. For example, to create a relatively shallow circular trench feature 708, the laser projector is operated at a lower power so that the irradiation penetrates the gallium semiconductor layer 704 to a relatively shallow depth. Similarly, to create a deeper circular trench feature 708, the laser projector is operated at a higher power so that the irradiation penetrates the gallium semiconductor 704 to a deeper depth. In some embodiments, the gallium semiconductor layer 704 is formed in connection with the LLO process to separate the substrate layer. For example, the light emitting face may be irradiated with portions of the light emitting face that correspond with the trench feature 708 being irradiated with higher power, or longer duration, than other portions of the light emitting face.

In some embodiments, the circular trench feature 708 is created by performing multiple passes. In other words, the irradiation and removal steps described above are performed multiple times in succession, which increases the depth of the circular trench feature 708 to be increased by a certain amount with each pass. Performing multiple passes advantageously allows for the creation of a circular trench feature 708 with a relatively smooth bottom surface because each pass can be performed at a relatively low laser power.

The circular trench feature 708 is advantageous, for example, because it can concentrate light extraction in the circular region 710 enclosed by the trench. As shown in FIG. 7C, some of the light rays 712 generated by the LED 700 are reflected internally off of the sides of the circular trench feature 708 as the light rays travel through the gallium semiconductor layer 704. This causes additional light rays to be emitted from the LED 700 from the enclosed circular region 710 on the LED's light-emitting surface, which concentrates the light extraction of the LED in this circular region.

Figure 8:
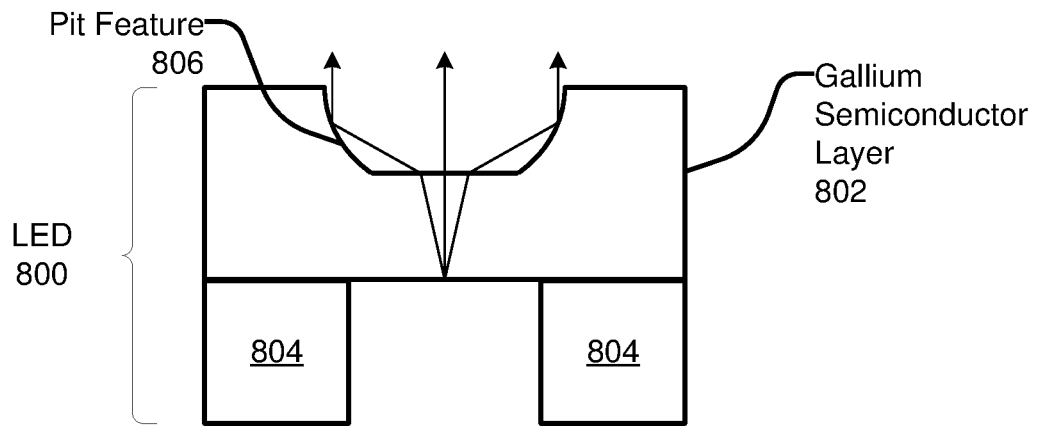
FIGS. 8, 9, and 10 illustrate examples of pit features and lens features that can be etched into a gallium semiconductor layer, in accordance with various embodiments.
Figure 9:
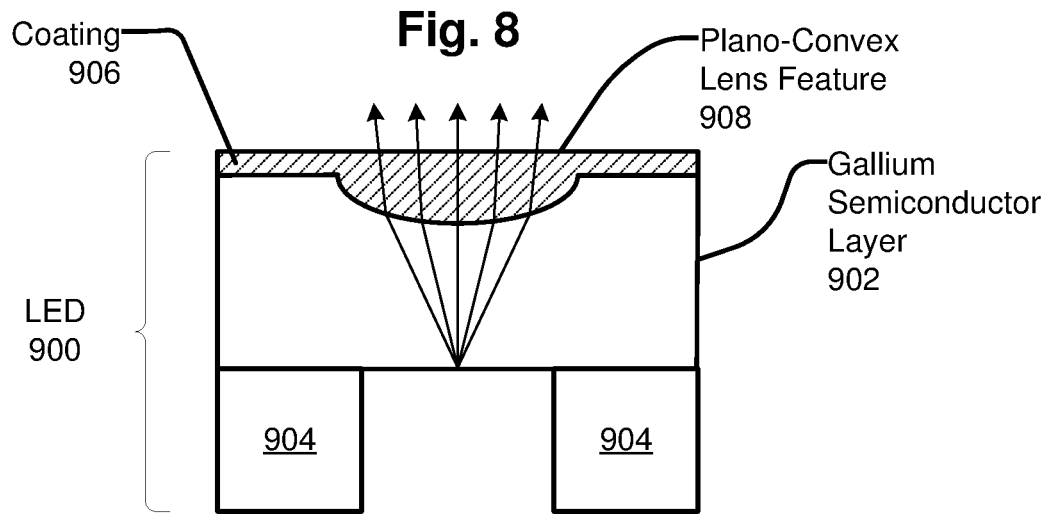
Figure 10:
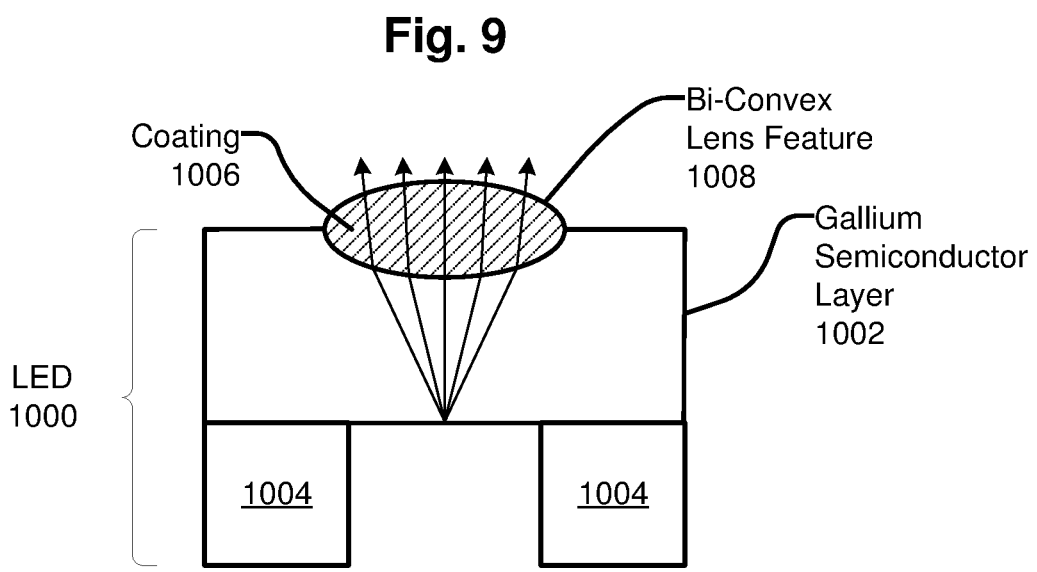

FIGS. 8-10 illustrate examples of pit features and lens features that can be etched into a gallium semiconductor layer, in accordance with various embodiments. Each of the LEDs 800, 900, 1000 shown in FIGS. 8-10 include a gallium semiconductor layer 802, 902, 1002 and contact pads 804, 904, 1004, which have the same functionality as the corresponding components in the LEDs described above. Each of the LEDs 800, 900, 1000 also includes a different type of feature that can improve the light extraction of the LED and/or the beam collimation of the light emitted by the LED.

Referring first to FIG. 8, illustrated is an LED 800 with a pit feature 806 etched into its gallium semiconductor layer 802. The pit feature 806 can be created in a similar manner as the circular trench feature 708 described above with respect to FIGS. 7A-7C. The laser projector is operated to irradiate a region of the gallium semiconductor layer 802 to create metallic gallium, and the metallic gallium is then removed to yield the pit feature 806. In the example shown in FIG. 8, the pit feature 806 includes a substantially flat bottom surface and walls that curve inward. In one embodiment, the pit feature 806 is a paraboloid with a truncated base (i.e., the walls of the pit are parabolic surfaces, and the bottom surface of the pit is planar). To create the curved walls, the parameters of the laser light can be varied so that the laser penetrates to a shallower depth near the edges of the pit feature 806. Additionally or alternatively, the curved walls of the pit feature 806 can be created by performing multiple passes, with each successive pass irradiating and removing metallic gallium from a smaller region than the previous pass.

The pit feature 806 shown in FIG. 8 is advantageous, among other reasons, because the shape of the pit can improve the collimation of the beam emitted by the LED 800. In particular, light beams are refracted as they pass through the flat bottom surface, and some of the refracted light beams are reflected off the curved side walls. The curvature of the side walls can be shaped to reflect these refracted beams so that they are substantially perpendicular to the light-emitting top surface of the LED 800, which results in improved beam collimation.

Referring next to FIGS. 9 and 10, illustrated are LEDs 900, 1000 with lens features 908, 1008. The LED 900 shown in FIG. 9 has a plano-convex lens feature 908 (i.e., a lens with one convex side facing the light emitting face and one planar side) and the LED 1000 in FIG. 10 has a bi-convex lens feature 1008 (i.e., a lens with two convex sides). The shape of both lens features 908, 1008 can improve beam collimation and light extraction.

The lens features 908, 1008 on these LEDs are created by first etching a concave pit into the gallium semiconductor layer 902, 1002 in the same manner as described above with respect to the pit feature 806 and the trench feature 708 (i.e., irradiating the gallium semiconductor layer and removing the resulting metallic gallium). After the concave pit is etched into the gallium semiconductor layer 902, 1002, a coating 906, 1006 is applied on the gallium semiconductor layer 902, 1002. The coating 906, 1006 is made of a material with a high refractive index.

To create the plano-convex lens feature 908 shown in FIG. 9, the coating 906 is applied over the top emitting surface of the gallium semiconductor layer 902 in a manner that creates a top surface that is substantially flat. A portion of the bottom surface of the coating 906 is in contact with the concave pit. As a result, the coating 906 has the shape of a plano-convex lens because the bottom surface of the coating 906 has a convex shape while the top surface of the coating 906 is planar.

In one embodiment, the bi-convex lens feature 1008 shown in FIG. 10 is created by using one or more micro-positioners (devices capable of positioning a material within very fine limits) to individually deposit the material that forms the coating. After depositing the material, the material is treated (e.g., by curing the material) to form a hardened lens-shaped coating 1006.

In another embodiment, the bi-convex lens feature is created by depositing a thin film of material on the top surface of the gallium semiconductor layer after etching the concave pit and then heating and re-flowing the material. The heating and re-flowing process coalesces the material in the concave pit, and the surface tension causes the material to form the bi-convex lens shape.

Each of the trench, pit, and lens features described above are created by irradiating a portion of an LED's gallium semiconductor layer and then removing the metallic gallium that is produced. The laser projector can also be operated to create mirror features on an LED by irradiating a region of the gallium semiconductor layer without removing the metallic gallium, which allows the metallic gallium to remain as part of the LED and function as a mirror.

Figure 11A:
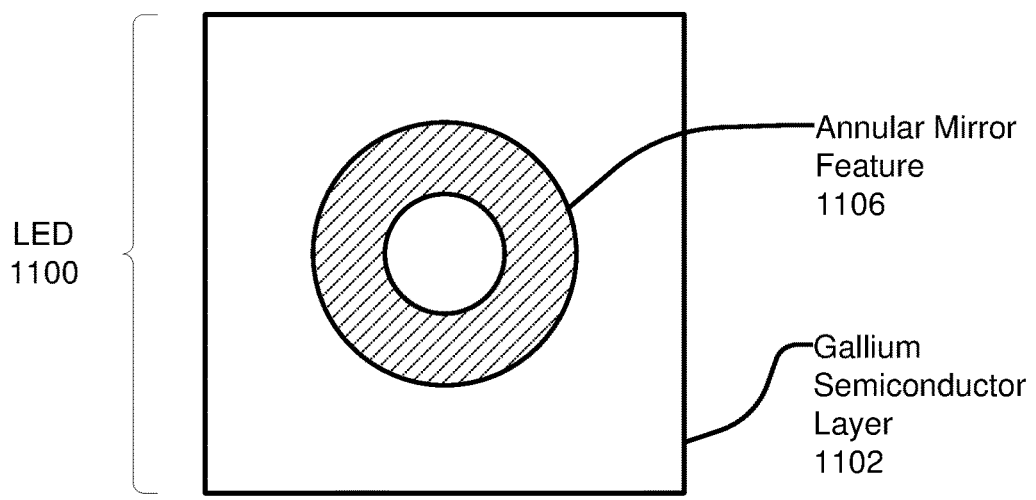
FIGS. 11A and 11B illustrate an example of an annular mirror feature that can be created in a gallium semiconductor layer, in accordance with one embodiment.
Figure 11B:
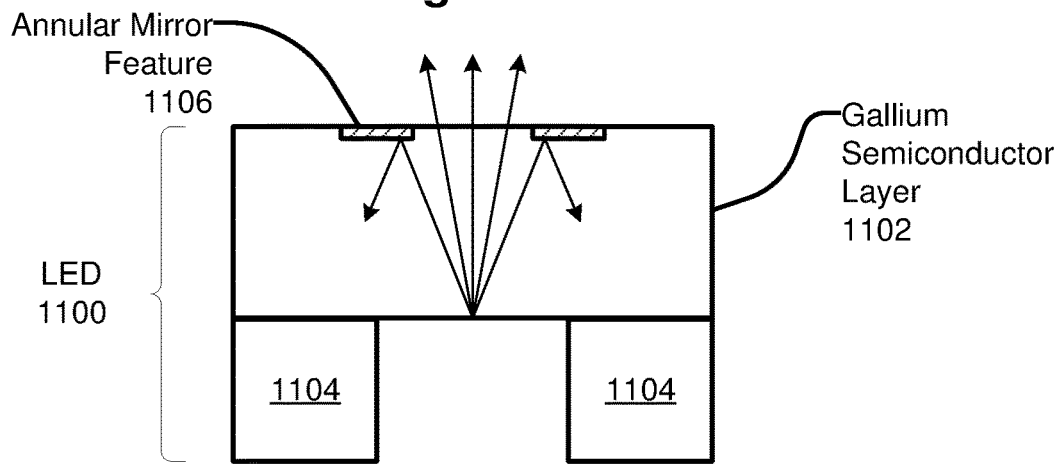

FIGS. 11A-11B illustrate an example of an annular mirror feature 1106, in accordance with one embodiment. FIG. 11A illustrates a top view of an LED 1100 with an annular mirror feature 1106, and FIG. 11B illustrates a side view of the LED 1100. Similar to the LEDs described above, the LED 1100 shown in FIGS. 11A-11B includes a gallium semiconductor layer 1102 (e.g., a layer of gallium nitride) and contact pads 1104. The annular mirror feature 1106 is created by irradiating an annular region of the light emitting surface (as shown in the top view in FIG. 11A) of the gallium semiconductor layer 1102. As described with respect to the other types of features, irradiating the annular region creates a layer of metallic gallium in the annular region.

After the annular region is irradiated, the gallium removal step is omitted, so the layer of metallic gallium is left behind on the light-emitting surface of the LED 1100. The layer of metallic gallium forms the annular mirror feature 1106. Because metallic gallium reflects light, light beams that strike the bottom surface of the annular mirror feature 1106 are reflected back into the gallium semiconductor layer 1102 rather than being emitted from the LED 1100. The annular shape of the annular mirror feature 1106 reflects light beams that would otherwise be emitted from the LED 1100 at relatively high angles. As a result, the annular mirror feature 1106 increases the LED's beam collimation. For example, the left-most and right-most light beams shown in FIG. 11B strike the bottom surface of the annular mirror feature 1106 and are reflected back into the gallium semiconductor layer 1102 while the three beams in the middle are emitted from the LED 1100.

Figure 12:
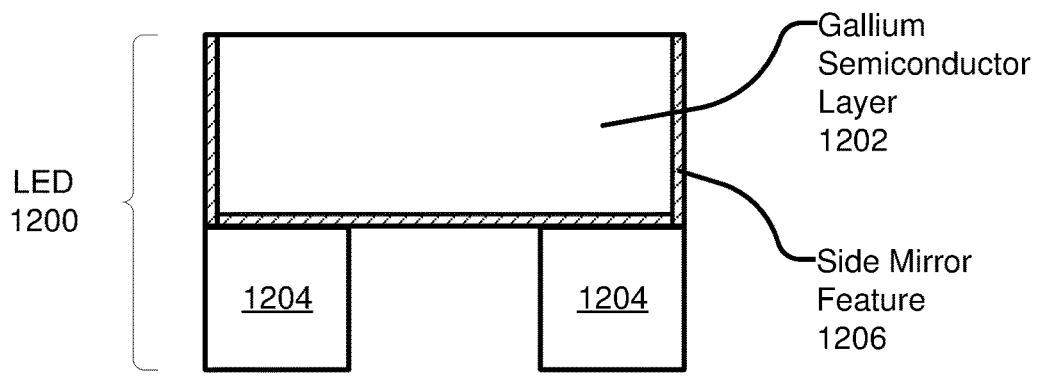
FIG. 12 illustrates an example of another type of mirror feature that can be created in a gallium semiconductor layer, in accordance with one embodiment.

FIG. 12 illustrates an example of an LED 1200 that includes a gallium semiconductor layer 1202, contact pads 1204, and a side mirror feature 1206, in accordance with one embodiment. The side mirror feature 1206 is created by irradiating the gallium semiconductor layer 1202 from the sides and back. In one embodiment, the laser light is projected onto the gallium semiconductor layer 1202 after the gallium semiconductor layer 1202 is grown on the grown substrate and before the contact pads 1204 are grown. In another embodiment, the carrier substrate 114 and the carrier stage 116 shown in FIG. 1 are both formed of a material that is substantially transparent to the laser light, and the laser light is projected onto back surface of the gallium semiconductor layer 1202 from below the carrier substrate 114 and the carrier stage.

The side mirror feature 1206 is advantageous, for example, because it reflects beams of light from each surface of the gallium semiconductor layer 1202 apart from the light-emitting surface. As a result, a larger proportion of the light beams are emitted from the light-emitting surface and a much smaller proportion of the light beams are emitted from the other surfaces, which improves light extraction of the LED 1200. In some embodiments, the side mirror feature 1206 causes nearly all the light beams to be emitted from the light-emitting surface.

Figure 13:
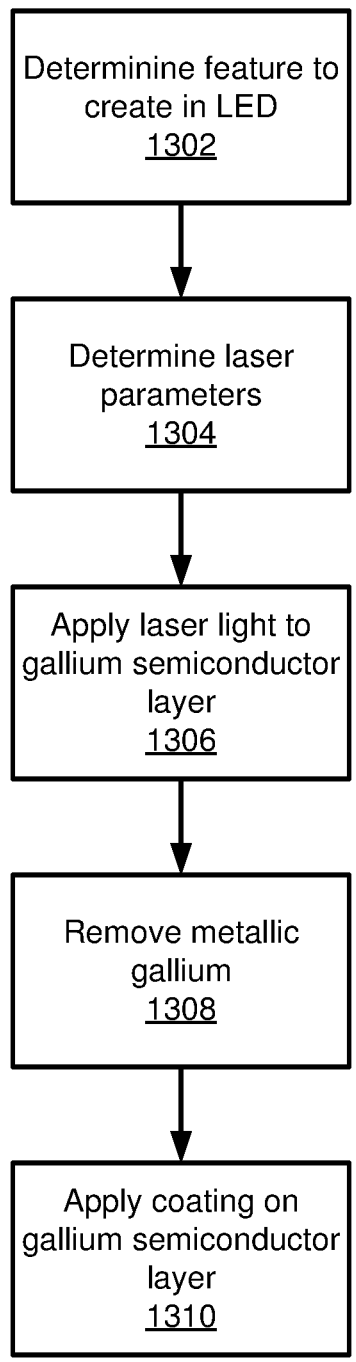
FIG. 13 is a flow chart illustrating a process for operating a laser to create one or more features in the gallium semiconductor layer of an LED, in accordance with one embodiment.

FIG. 13 is a flow chart illustrating a process 1300 for operating a laser to create one or more features in the gallium semiconductor layer of an LED, in accordance with one embodiment. The process 1300 may include different and/or additional steps, or some steps may be in different orders.

The process 1300 includes determining 1302 a feature to be created in one or more surfaces of the LED, such as the light emitting face. As described in the examples above, the feature can be a trench, pit, lens, or mirror formed at the light emitting face of the gallium semiconductor layer. Each feature is associated with a desired depth and occupies a region of the gallium semiconductor layer. For example, the circular trench feature 708 described with respect to FIGS. 7A-7C occupies a ring-shaped region of the gallium semiconductor layer. Similarly, the pit feature 806 described with respect to FIG. 8 occupies a round region, and the annular mirror feature 1106 described with respect to FIGS. 11A-11B occupies an annular region.

Laser parameters are determined 1304 so that the laser light penetrates the gallium semiconductor layer to form a recessed region in the gallium semiconductor layer having the desired depth, and a laser projector is operated to apply 1306 the laser light having the determined laser parameters to the LED's gallium semiconductor layer. Applying the laser light to the gallium semiconductor layer irradiates the gallium semiconductor layer to form the recessed region and a metallic gallium layer in the recessed region. In some embodiments, the recessed region encompasses a portion of the light emitting face of the gallium semiconductor layer and also excludes a portion of the light emitting face (i.e., the entire light emitting surface is not irradiated). In other embodiments, the entire light emitting face may be irradiated, such as when the creation of the feature is performed in connection with LLO process for the substrate layer. Here, the portions of the light emitting face corresponding to the feature may be irradiated with greater power, duration, additional cycles, etc. than the other portions.

The irradiation ablates the region of the gallium semiconductor layer and separates the gallium semiconductor layer into its constituent components including a layer of metallic gallium. As described above, the laser parameters can include the power of the laser light. A higher-power laser light penetrates to a deeper depth in the gallium semiconductor layer, whereas a lower-power laser light penetrates to a shallower depth but results in a layer of metallic gallium with a more uniform thickness.

If the feature being created is a mirror feature, then the metallic gallium layer is left on the gallium semiconductor layer. If another type of feature is being created, then the metallic gallium layer is removed 1308 in a gallium cleaning operation (e.g., an acid wet etch or a dry etch). Together, the steps of applying 1306 the laser light to a region of the gallium semiconductor layer and removing 1308 the metallic gallium have the effect of etching a structure into the gallium semiconductor layer. For example, the circular trench feature 708 shown in FIGS. 7A-7C and the pit feature 806 shown in FIG. 8 are both etched into the gallium semiconductor layer in this manner.

A coating can be applied 1310 to the gallium semiconductor layer. For example, if a lens feature is being created, the coating is a material with a high refractive index that is applied so that one side of the coating is in contact with a concave pit that was etched into the gallium semiconductor layer (e.g., via the irradiation and removal steps 1306, 1308 described above) and the opposite side of the coating either has a flat shape or a convex shape. This results in a coating that has the shape of either a plano-convex lens or a bi-convex lens. In some embodiments, this step of applying 1310 the coating is omitted. For example, the step 1310 may be omitted when creating the trench, pit, and mirror features shown in FIGS. 7A-7C, FIG. 8, and FIGS. 11-12, respectively.

Additional Configuration Considerations

As used herein, the terms substantially and approximately indicate that a quantity does not differ from a fixed value by more than a threshold value. The threshold value may be defined as a percentage deviation from the fixed value or a numerical deviation that is measured in the same units as the fixed value. Similarly, when a plurality of values are described as being substantially or approximately the same, the terms substantially and approximately indicate that the values do not deviate from each other by more than a threshold value. For example, when adjacent pulses are described as having approximately the same overlapping area, the smallest overlapping area does not differ from the largest overlapping area by more than a threshold percentage or a threshold area.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
    determining a desired roughness for a light emitting face of a gallium semiconductor layer of a light emitting diode (LED), the light emitting face configured to emit light generated by the LED;
    determining a distance between adjacent pulses of a laser light to achieve the desired roughness when the laser light is projected onto the light emitting face of the gallium semiconductor layer;
    operating a laser projector to apply the laser light in a scanning pattern with the determined distance onto the light emitting face of the gallium semiconductor layer, a portion of the gallium semiconductor layer absorbing the laser light to form a metallic gallium layer at the light emitting face; and
    removing the metallic gallium layer from the gallium semiconductor layer to expose a light emitting face having the desired roughness.

2. The method of claim 1, wherein the gallium semiconductor layer includes gallium nitride.

3. The method of claim 1, wherein the laser projector projects a pulsed ultraviolet (UV) laser light.

4. The method of claim 1, wherein the laser projector is operated while the gallium semiconductor layer is attached to a substrate, and the laser light is transmitted to the light emitting face of the gallium semiconductor layer through the substrate, and further comprising melting the metallic gallium layer to debond the gallium semiconductor layer and the substrate.

5. The method of claim 4, wherein the gallium semiconductor layer is grown on the substrate.

6. The method of claim 1, wherein the desired roughness is an arithmetical mean deviation of between 3 nm and 7 nm.

7. The method of claim 1, wherein the desired roughness is an arithmetical mean deviation of between 950 nm and 1050 nm.

8. A method, comprising:
    determining a desired depth associated with a feature in a light emitting face of a gallium semiconductor layer of a light emitting diode (LED), the light emitting face configured to emit light generated by the LED;

determining a distance between adjacent pulses of a laser light emitted by a laser projector to form a recessed region of the gallium semiconductor layer having the desired depth associated with the feature when the laser light is projected onto the light emitting face of the gallium semiconductor layer; and operating the laser projector to apply the laser light in a scanning pattern with the determined distance onto the light emitting face of the gallium semiconductor layer, a portion of the gallium semiconductor layer absorbing the laser light to form the recessed region of the gallium semiconductor layer and a metallic gallium layer in the recessed region.

9. The method of claim 8, wherein the feature is an annular mirror feature comprising the metallic gallium layer, the metallic gallium layer having an annular shape.

10. The method of claim 8, further comprising:
removing the metallic gallium layer from the recessed region of the gallium semiconductor layer.

11. The method of claim 10, wherein the feature is a ring-shaped trench feature at the light emitting face of the gallium semiconductor layer.

12. The method of claim 10, wherein the feature is a pit feature at the light emitting face of the gallium semiconductor layer, the pit feature having parabolic side surfaces and a planar bottom surface.

13. The method of claim 10, further comprising:
after removing the metallic gallium layer from the recessed region of the gallium semiconductor layer, applying a coating to the gallium semiconductor layer.

14. The method of claim 13, wherein removing the metallic gallium layer from the recessed region exposes a concave pit, wherein a first surface of the coating is in contact with the concave pit and has a convex shape, wherein a second surface of the coating opposite to the first surface has a planar shape, and wherein the feature is a plano-convex lens comprising the coating.

15. The method of claim 13, wherein removing the metallic gallium layer from the recessed region exposes a concave pit, wherein a first surface of the coating is in contact with the concave pit and has a convex shape, wherein a second surface of the coating opposite to the first surface has a convex shape, and wherein the feature is a bi-convex les comprising the coating.

16. A light emitting diode (LED) fabricated by a method, the method comprising:
determining a desired roughness for a light emitting face of a gallium semiconductor layer of the LED, the light emitting face configured to emit light generated by the LED;

determining a distance between adjacent pulses of a laser light to achieve the desired roughness when the laser light is projected onto the light emitting face of the gallium semiconductor layer;

operating a laser projector to apply the laser light in a scanning pattern with the determined distance onto the light emitting face of the gallium semiconductor layer, a portion of the gallium semiconductor layer absorbing the laser light to form a metallic gallium layer at the light emitting face; and removing the metallic gallium layer from the gallium semiconductor layer to expose a light emitting face having the desired roughness.

17. The LED of claim 16, wherein the gallium semiconductor layer includes gallium nitride.

18. The LED of claim 16, wherein the laser projector projects a pulsed ultraviolet (UV) laser light.

19. The LED of claim 16, wherein the laser projector is operated while the gallium semiconductor layer is attached to a substrate, and the laser light is transmitted to the light emitting face of the gallium semiconductor layer through the substrate, and further comprising melting the metallic gallium layer to debond the gallium semiconductor layer and the substrate.

20. The LED of claim 16, wherein the desired roughness is an arithmetical mean deviation of between 950 nm and 1050 nm.

* * * * *